United States Patent [19]

Schwalke

[11] Patent Number: 5,445,988
[45] Date of Patent: Aug. 29, 1995

[54] METHOD FOR MANUFACTURING A TRENCH IN A SUBSTRATE FOR USE IN SMART-POWER TECHNOLOGY

[75] Inventor: Udo Schwalke, Heldenstein, Germany

[73] Assignee: Siemens Aktiengesellschaft, Munich, Germany

[21] Appl. No.: 272,591
[22] Filed: Jul. 11, 1994
[30] Foreign Application Priority Data Jul. 13, 1993 [DE] Germany ............... 43 23 423.2

[51] Int. Cl.⁶ .......................................... H01L 21/76
[52] U.S. Cl. .................................. 437/67; 437/62; 437/228
[58] Field of Search ............... 437/67, 228, 26, 164, 437/61, 62, 974; 156/653, 643; 148/DIG. 50, DIG. 12; 257/520

[56] References Cited

U.S. PATENT DOCUMENTS

| | | | |
|---|---|---|---|
| 4,493,740 | 1/1985 | Komeda | 257/501 |
| 4,666,556 | 5/1987 | Fulton et al. | 156/643 |
| 4,666,557 | 5/1987 | Collins | 156/643 |
| 4,872,947 | 10/1989 | Wang et al. | 156/64.3 |
| 4,900,692 | 2/1990 | Robinson . | |
| 5,008,210 | 4/1991 | Chiang et al. | 437/67 |
| 5,017,999 | 5/1991 | Roisen . | |
| 5,036,021 | 7/1991 | Goto | 437/67 |
| 5,043,292 | 7/1991 | Aronowitz et al. | 437/67 |
| 5,049,521 | 9/1991 | Belanger et al. . | |
| 5,077,228 | 12/1991 | Eklund et al. . | |
| 5,096,848 | 3/1992 | Kawamura | 437/67 |
| 5,116,779 | 5/1992 | Iguchi | 437/67 |
| 5,120,675 | 6/1992 | Pollack | 437/67 |

FOREIGN PATENT DOCUMENTS

| | | |
|---|---|---|
| 0061855 | 3/1982 | European Pat. Off. . |
| 0395330 | 4/1990 | European Pat. Off. . |
| 0444836 | 2/1991 | European Pat. Off. . |
| 2-16751(A) | 1/1990 | Japan ............... 437/67 |
| 2-203549(A) | 8/1990 | Japan ............... 437/67 |
| 5-144930(A) | 6/1993 | Japan ............... 437/67 |

OTHER PUBLICATIONS

S. Wolf, Silicon Processing for VLSI Era. vol. 2, pp. 204–206, copyright 1990 by Lattice Press.
IBM "Technical Disclosure Bulletin", vol. 34, No. 9, Feb. 1992, entitled Soft Error Rate Reduction in Trench Technology, p. 117.
A. Nakagawa et al., "New 500V Output Device Structures for Thin Silicon Layer on Silicon Dioxide Film", International Symposium on Power Semiconductor Devices & IC's, (1990), pp. 97–101.
Y. Ohata et al., "Dielectrically Isolated Intelligent Power Switch", IEEE 1987 Custom Integrated Circuits Conference, pp. 443–446.
K. D. Beyer et al., "Borosilicate Glass Trench Fill", IBM Technical Disclosure Bulletin, vol. 27, No. 2 Jul. 1984, pp. 1245–1247.
"Formation of Thermal Isolation Cap Oxide", IBM Technical Disclosure Bulletin, vol. 33, No. 4 Sep. 1990, pp. 463–465.
K. Shenai, "A Novel Trench Planarization Technique Using Polysilicon Refill, Polysilicon Oxidation, and Oxide Etchback", IEEE Transactions on Electron Devices, vol. 40, No. 2, Feb. 1993, pp. 459–463.
Patent Abstract of Japan, T. Ezaki, "Forming Method for Isolating Region", 62-257575, Apr. 18, 1989, E-795, Jul. 28, 1989, vol. 13/No. 338, pp. 149–151.
J. Wang, "Selective Substrate Contact With Dual Width Trenches", Motorola Inc., Technical Developments, vol. 18, Mar. 1993, pp. 18–21.
IBM Technical Disclosure Bulletin, "Trench Filling Process"; vol. 28, No. 6, Nov. 1985, pp. 2583–2584.
IBM Technical Disclosure Bulletin, "Fabrication of a Sub-Minimum Lithography Trench", vol. 29, No. 6, Nov. 1986, pp. 2760–2761.

Primary Examiner—George Fourson
Assistant Examiner—S. Mulpuri
Attorney, Agent, or Firm—Hill, Steadman & Simpson

[57] ABSTRACT

A method for manufacturing a trench in a substrate that has at least a first silicon layer, an insulating layer and a second silicon layer is disclosed. A first trench etching through the first silicon layer down to the insulating layer is implemented using a trench mask. By reinforcing the trench mask with a non-conformally deposited protective layer, the insulating layer is etched through down to the second silicon layer in a second trench etching. The method is particularly suited for the manufacture of insulation trenches having integrated substrate contacting for smart-power technology on an SOI substrate.

13 Claims, 7 Drawing Sheets

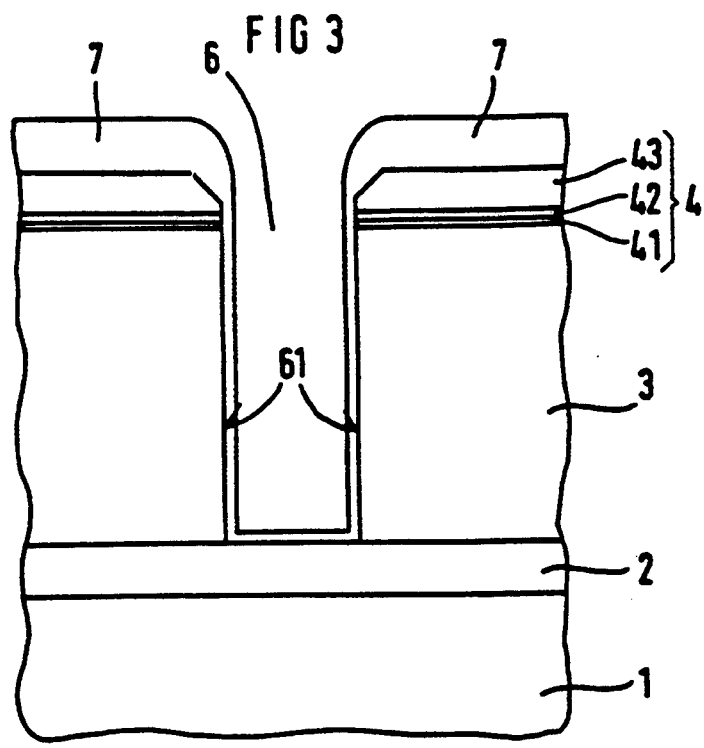
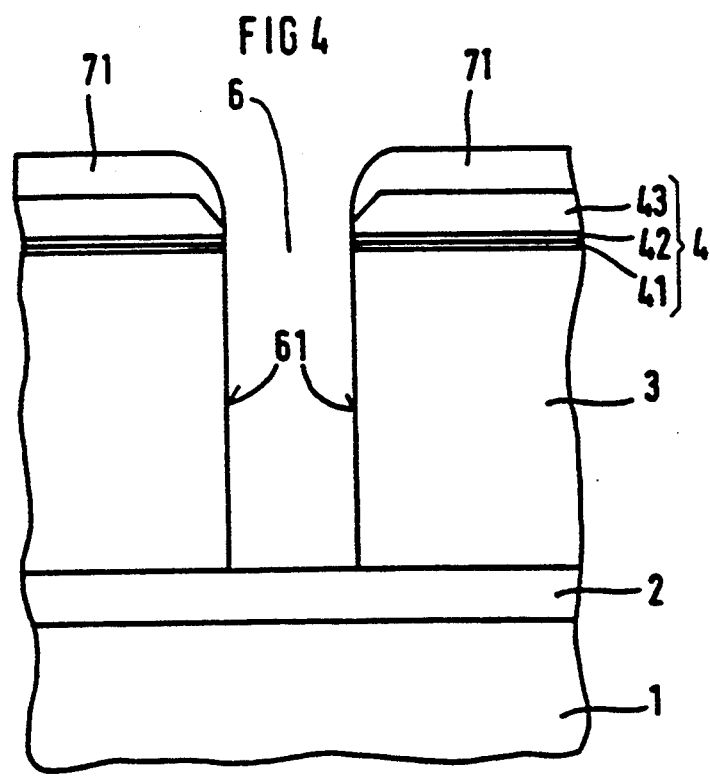

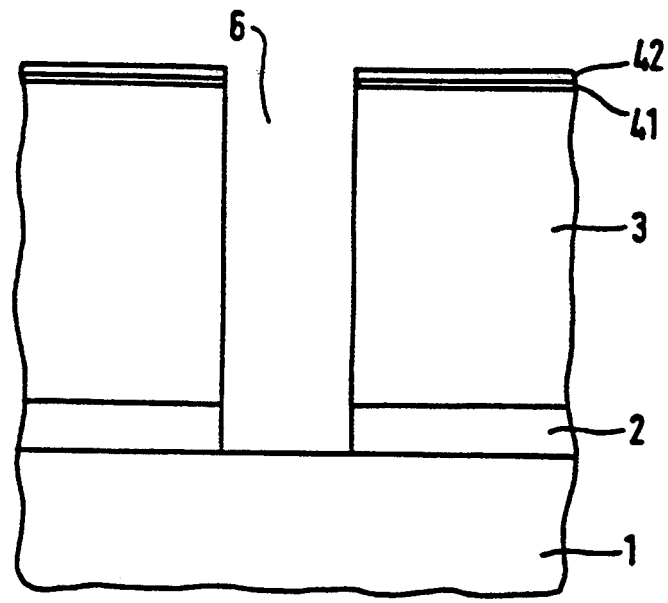
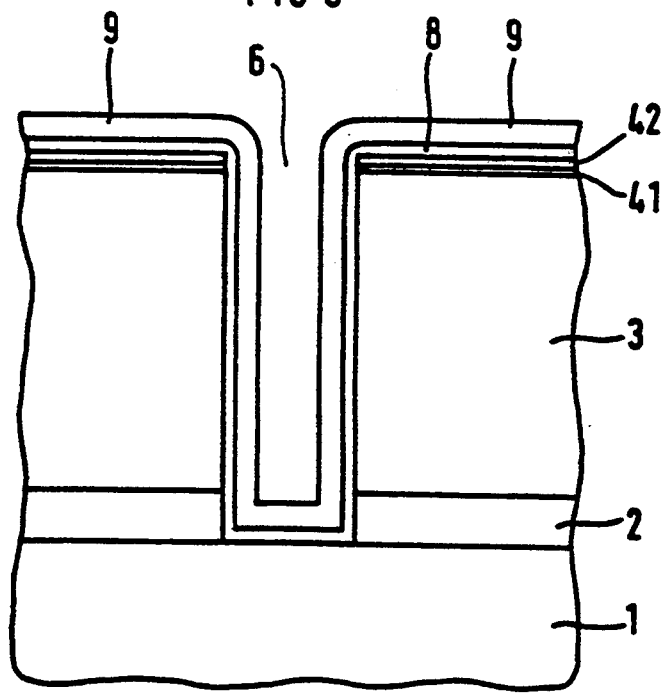

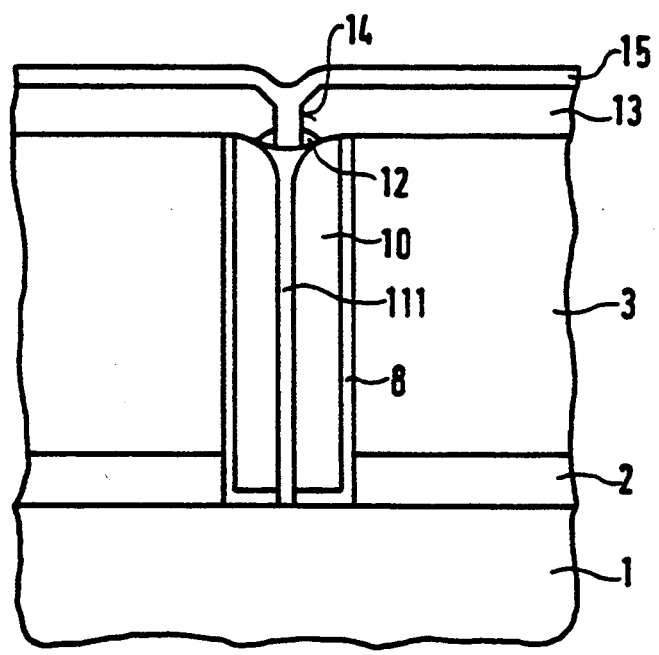

5,445,988

METHOD FOR MANUFACTURING A TRENCH IN A SUBSTRATE FOR USE IN SMART-POWER TECHNOLOGY

BACKGROUND OF THE INVENTION

1. Field of the Invention

The present invention is directed generally to semiconductors and more specifically to a method for manufacturing a trench in a substrate for use in smart-power technology.

2. Description of the Related Art

For various applications, it is necessary to manufacture trenches having a high aspect ratio (aspect ratio is the quotient of trench depth to trench width) in substrates that comprise a first silicon layer at least at the surface, an insulating layer therebelow, and a second silicon layer below the latter. The trenches should thereby extend through the first silicon layer and through the insulating layer down to the second silicon layer.

For example, such trenches are required for contacting circuit elements in three-dimensional circuits that are realized in silicon layers arranged above one another but respectively separated by insulating layers.

A further use of such trenches occurs in smart-power technology on SOI substrates. In smart-power technology, complex logic components are monolithically integrated in one substrate with high-voltage power components. Since the logic components are operated with voltage levels of around 5 volts but voltages up to 500 volts occur at the high-voltage power components, an electrical separation of the high-voltage components from the logic components is required.

It is known (see, for example Yu Ohata et al, IEEE CICC, pages 443–446; A. Nakagawa et al, ISPS 1990, pages 97–101) to completely electrically insulate the high-voltage and low-voltage components from one another by dielectric insulation. To that end, the components are in a SOI substrate. An SOI substrate has an insulating layer of $SiO_2$ on a monocrystalline wafer and a monocrystalline silicon layer on the insulating layer. This monocrystalline silicon layer is the surface of the SOI substrate. The components are in the monocrystalline layer. The insulating layer of the SOI substrate produces the vertical insulation, whereas the lateral insulation of the components is realized by trenches filled with insulating material. These trenches extend down to the surface of the insulating layer. They completely surround the component to be insulated in the monocrystalline silicon layer. For filling the trenches, for example, the sidewall is thermally oxidized, the remaining interspace is filled with polysilicon, is etched back and, subsequently, is oxidized at the surface. The trench filling is then has a polysilicon core that is completely enclosed by silicon oxide.

The trench is produced by using a trench mask that is predominantly $SiO_2$. When the trench is to be etched through the insulating layer down to the surface of the monocrystalline silicon wafer, which represents the second silicon layer in this case for example, to produce a contact to the monocrystalline silicon wafer, the trench mask is also attacked in this etching. When the thickness of the trench mask is comparable to or less than that of the insulating layer, then the surface of the silicon layer in which the active components are integrated is incipiently etched and damaged in this etching.

SUMMARY OF THE INVENTION

The invention provides a method for manufacturing a trench in a substrate such that a trench extending through a first silicon layer and through an insulating layer can be manufactured without damaging the surface of the first silicon layer. In particular, the method is advantageous for manufacturing an insulating trench for smart-power technologies on an SOI substrate.

The present invention achieves the objects in a method for manufacturing a trench in a substrate, the substrate having at least one first silicon layer oriented at the surface of the substrate, an insulating layer oriented therebelow, and a second silicon layer oriented under the insulating layer. The method has the steps of providing the substrate with a trench mask having a horizontal surface, conducting a first trench etching through the trench mask down to the surface of the insulating layer to form a trench having sidewalls and a bottom, non-conformally depositing a protective layer surface-wide on the substrate to a greater thickness on the horizontal surface of the trench mask than at the sidewalls and at the bottom of the trench, conducting a second trench etching through the trench mask down to the surface of the second silicon layer to achieve a prescribed depth of the trench, and setting the greater thickness of the protective layer on the horizontal surface of the trench mask so that an etch-through of the insulating layer and a removal of the protective layer and the trench mask on the horizontal surface are essentially simultaneously achieved in the second trench etching.

Inventively, a formation of the trench occurs in two trench etchings. In a first trench etching, the first silicon layer is etched through down to the surface of the insulating layer. The trench mask is then reinforced by a non-conformally deposited protective layer. In the non-conformal deposition, the thickness of the protective layer on horizontal surfaces of the trench mask is greater than at the sidewalls and at the bottom of the trench. In a second trench etching, the insulating layer is subsequently etched-through, so that the trench extends down to the surface of the second silicon layer. The thickness of the protective layer on the horizontal surfaces of the trench mask is thereby set to at least such a size that a through-etching of the insulating layer and a removal of the protective layer and the trench mask on horizontal surfaces is essentially simultaneously achieved in the second trench etching. This measure assures that the first silicon layer is not attacked when etching through the insulating layer. Since the protective layer has not been conformally deposited, a simultaneous protection of the surface of the first silicon layer and a through-etching of the insulating layer are possible.

It is especially advantageous to produce the protective layer by non-conformal deposition of CVD $SiO_2$. Numerous non-conformal deposition processes are known in semiconductor technology wherein the non-conformity of the deposition is usually considered to be a disadvantage. In the method of the invention, the non-conformal deposition is intentionally utilized. It is thereby advantageous to select deposition methods wherein the thickness difference on the horizontal surface and at vertical sidewalls is especially large because only a thin, additional layer that must be removed in the second trench etching then occurs in the trench.

It particularly lies within the scope of the invention to form the protective layer in a plasma-enhanced CVD method by decomposition of $Si(OC_2H_5)_4$ (TEOS) or by deposition at atmospheric pressure of borosilicate glass, phosphorous silicate glass or borophosphorous silicate glass.

When the protective layer is formed of borosilicate glass or of phosphorous silicate glass, it lies within the scope of the invention to implement a temperature step after the deposition of the protective layer and before the second trench etching. In this temperature step, diffusion regions neighboring the trench are formed in the first silicon layer by drive-out of dopant from the protective layer. Such diffusion regions neighboring an insulating trench are utilized in smart-power technology for improving the voltage behavior of the circuit. These diffusion regions can be manufactured in the method of the invention without additional layer deposition.

It also lies within the scope of the invention to provide the sidewalls of the trench with an insulation structure and to fill the trench with a silicon fill of, for example, silicon doped in situ. The silicon fill thereby extends down to the surface of the second silicon layer. A contact to the second silicon layer can be formed via a doped silicon fill for example, to thus realize an electrical shielding of the components from one another. Where the second silicon layer and the silicon fill are doped with opposite conductivity types, then a diode is produced in this way.

The insulation structure at the sidewalls of the trench is manufactured, in particular, by surface-wide deposition of an essentially conformal silicon layer and anisotropic re-etching of the conformal silicon layer selectively relative to the support and by subsequent thermal oxidation. The insulation structure thereby occurs in the form of oxidized silicon spacers. In order to achieve the selectivity for the anisotropic etching, it lies within the scope of the invention to deposit a layer of, for example, $Si_3N_4$ under the conformal silicon layer. The uncovered part of the $Si_3N_4$ layer must then be removed at the bottom of the trench.

The method is especially suited for the manufacture of a trench in an SOI substrate, whereby the first silicon layer forms the monocrystalline silicon layer, the insulating layer forms the buried $SiO_2$ layer and the second silicon layer forms the monocrystalline silicon wafer of the SOI substrate.

The method can also be used to produce trenches in a substrate that has at least two silicon layers, each of which is respectively insulated from the next silicon layer by an insulating layer lying therebelow.

The invention shall be set forth in greater detail below with reference to an exemplary embodiment and to the figures.

BRIEF DESCRIPTION OF THE DRAWINGS

FIG. 3 shows the SOI substrate after deposition of a protective layer of the present invention.

FIG. 4 shows the SOI substrate after the removal of parts of the protective layer that are arranged at the sidewalls and at the bottom of the trench of the present invention.

FIG. 5 shows the SOI substrate after the second trench etching of the present invention.

FIG. 6 shows the SOI substrate after deposition of a $Si_3N_4$ layer and of a conformal silicon layer of the present invention.

FIG. 13 shows the SOI substrate after deposition of a passivation layer and manufacture of a via hole to the silicon fill in the trench filled with a metallization of the present invention.

DETAILED DESCRIPTION OF THE PREFERRED EMBODIMENTS

Figure 1:
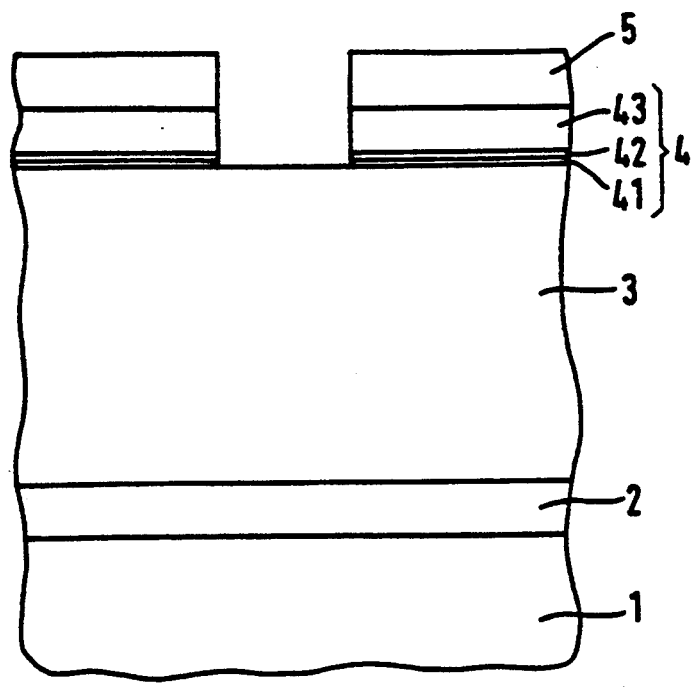
FIG. 1 shows an SOI substrate with trench mask of the present invention.

An SOI substrate has a monocrystalline silicon wafer 1 that, for example, is $p^+$-doped, and has an insulating layer 2 of $SiO_2$ arranged thereon, and a monocrystalline silicon layer 3 arranged on the insulating layer 2 (see FIG. 1 ). The monocrystalline silicon wafer 1 thereby corresponds to a second silicon layer. The monocrystalline silicon layer 3 corresponds to a first silicon layer.

The SOI substrate is preferably manufactured according to the direct wafer bonding (DWB) or silicon direct bonding (SDB) method that, for example, is known from Yu Ohata et al, IEEE 1987 CICC, pages 443–446. For example, the thickness of the insulating layer 2 is 2 μm. The thickness of the monocrystalline silicon layer 3 is for example, 20 μm. The monocrystalline silicon layer 3 is lightly n-doped. The dopant concentration in the monocrystalline silicon layer 3 is, for example, $10^{14}$ phosphorous atoms/cm$^3$. Components of a smart-power circuit are manufactured later in the monocrystalline silicon layer 3.

A trench mask 4 is applied onto the surface of the monocrystalline silicon layer 3. The trench mask 4 has a lower layer 41, a middle layer 42 and an upper layer 43. The lower layer 41 is produced, for example, by thermal oxidation with a thickness of 50 nm. The middle layer 42 is produced with a thickness of 150 nm, for example by CVD deposition of $Si_3N_4$. The upper layer 43 is manufactured with a thickness of 1600 nm, for example by CVD deposition of $SiO_2$. For structuring the trench mask 4, a lacquer mask 5 is applied onto this layer sequence. The trench mask 4 is structured with the assistance of the lacquer mask 5 in a $CHF_3/O_2$ dry etching process. The trench mask 4 must be suitable for etching a deep trench.

Figure 2:
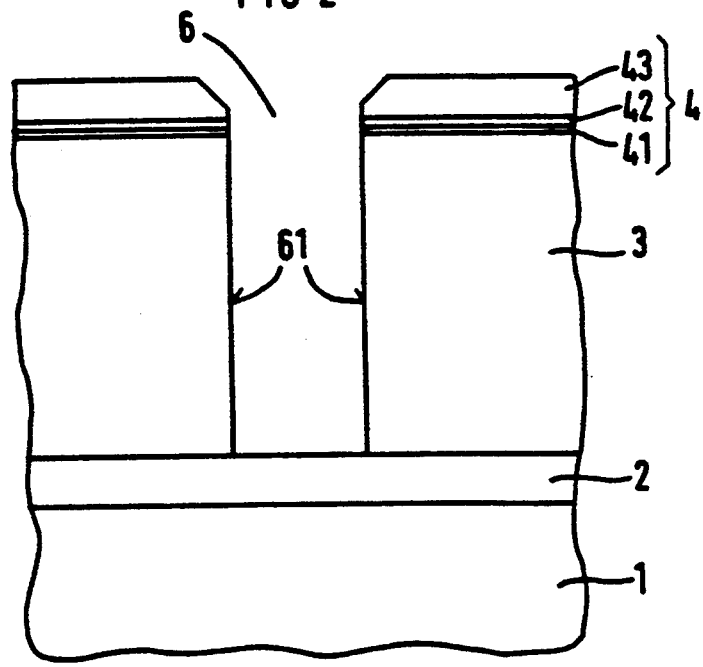
FIG. 2 shows the SOI substrate after the first trench etching of the present invention.

After removal of the lacquer mask 5 by lacquer stripping, a trench 6 is etched into the monocrystalline silicon layer 3 in a first trench etching by using the trench mask 4 (see FIG. 2). The etching occurs anisotropically in a dry etching process with a $Cl_2/O_2$ chemistry. The etching occurs selectively relative to $SiO_2$. The etching therefore stops as soon as the surface of the insulating layer 2 is uncovered. For forming clean sidewalls of the trench 6, etching products located at the sidewalls are removed in a HF dip.

The width of the trench 6 is, for example, 3 μm. The trench 6 completely surrounds a region of the monocrystalline silicon layer 3 in which a component to be insulated is manufactured later. A protective layer 7 is applied surface-wide by non-conformal CVD deposition of $SiO_2$. At the surface of the trench mask 4, the protective layer 7 has thickness of, for example, 2 μm. Due to the non-conformal deposition, the thickness of the protective layer 7 at the surface of the sidewalls 61 as well as at the surface of the insulating layer 2 is far, far less. In plasma-enhanced CVD deposition in a TEOS method, the layer thickness at the surface of the sidewalls 61 is approximately 400 nm (see FIG. 3).

When diffusion regions (not shown) neighboring the trench 6 are to be produced in the sidewalls 61, then the protective layer 7 is formed of doped glass, borosilicate glass or phosphorous silicate glass dependent on the type of doping, by APCVD deposition. After the deposition of the protective layer 7, the dopant is driven into the sidewalls 61 by a tempering at, for example 1000° C., whereby a diffusion region is formed.

The parts of the protective layer 7 arranged at the surface of the sidewalls 61 and of the insulating layer 2 are removed in an isotropic wet-chemical etching, for example in a HF dip. A protective layer residue 71 thereby remains at the surface of the trench mask since the protective layer 7 was substantially thicker here. The protective layer residue 71 and the upper layer 43 of the trench mask 4 have an overall thickness of approximately 3 μm (see FIG. 4).

A second trench etching is subsequently implemented. To that end, the insulating layer 2 is etched down to the surface of the monocrystalline wafer 1 with anisotropic dry etching (see FIG. 5). This anisotropic dry etching occurs selectively relative to silicon and therefore stops at the surface of the monocrystalline silicon wafer 1. For example, a $CHF_3/O_2$ process is suitable as dry etching. In the dry etching, the protective layer residue 71 and the upper layer 43 of the trench mask 4 are simultaneously removed. The thickness of the protective layer residue 71 and of the upper layer 43 of the trench mask 4 must be so large that an attack of the surface of the monocrystalline silicon layer 3 is avoided in the second trench etching. The protective layer 7 should therefore be deposited at least in such a thickness on horizontal surfaces of the trench mask 4 that a through-etching of the protective layer 7 and of the insulating layer 2 occurs at essentially the same point in time in the second trench etching.

A $Si_3N_4$ layer 8 having a thickness of, for example, 40 nm is deposited surface-wide by CVD deposition. An amorphous silicon layer 9 having a thickness of, for example, 400 nm is deposited onto the $Si_3N_4$ layer 8. The amorphous silicon layer 9 has an essentially conformal edge coverage (see FIG. 6).

The amorphous silicon layer 9 is undoped. Instead of the amorphous silicon layer 9, a polysilicon layer can also be employed. Amorphous silicon, however, is preferred because of the finer structure when compared to polysilicon. The layer thickness of the amorphous silicon layer 9 is optimized to the given trench geometry dependent on the trench width.

Figure 7:
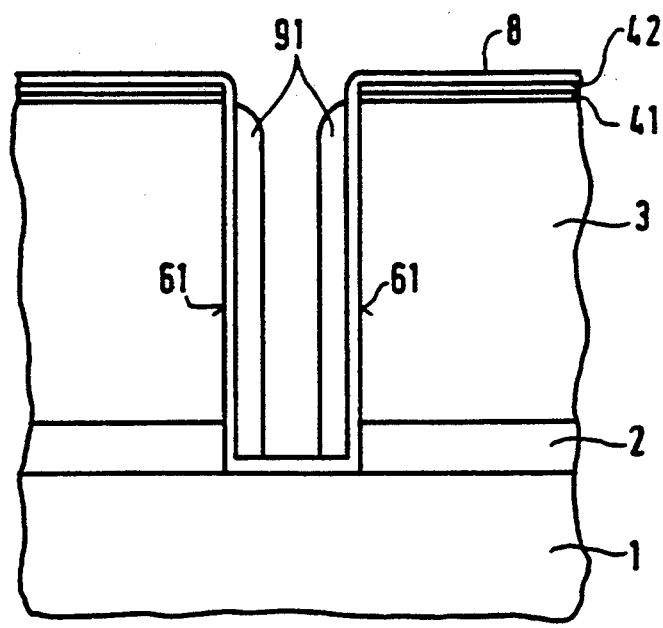
FIG. 7 shows the SOI substrate after the manufacture of silicon spacers of the present invention.
Figure 8:
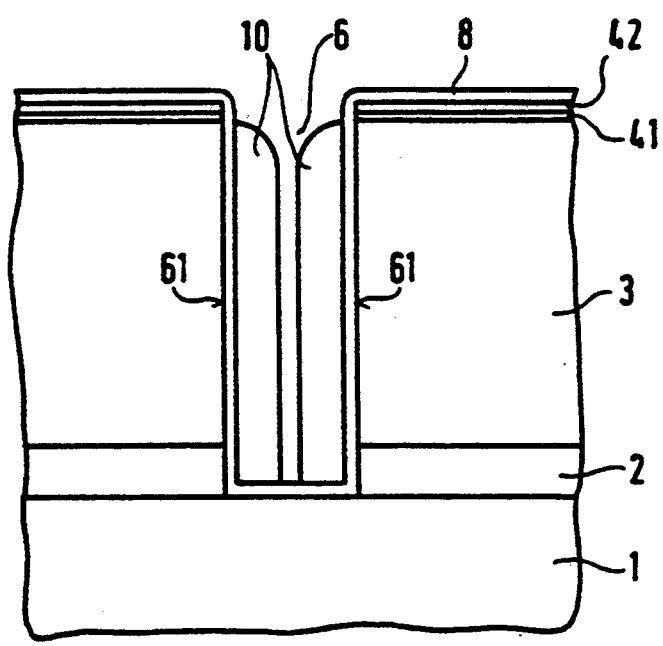
FIG. 8 shows the SOI substrate after manufacture of an insulation structure by oxidation of the silicon spacers of the present invention.

Subsequently, an anisotropic etching that is selective relative to $Si_3N_4$ is implemented, the horizontal surfaces of the $Si_3N_4$ layer 8 being uncovered therein and silicon spacers 91 being thereby formed from the amorphous silicon layer 9 (See FIG. 7).

An insulation structure 10 is produced by thermal oxidation of the silicon spacers 91 at, for example, 1000° C. in a humid atmosphere. The insulation structure 10 covers the $Si_3N_4$ layer 8 in the region of the sidewalls 61. The surface of the $Si_3N_4$ layer is uncovered at the bottom of the trench 6.

Figure 9:
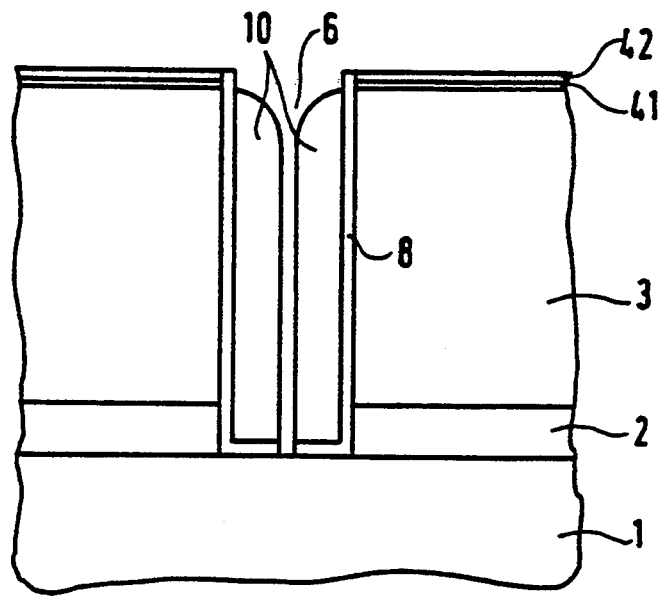
FIG. 9 shows the SOI substrate after removal of the uncovered parts of the $Si_3N_4$ layer arranged at the bottom of the trench of the present invention.

The $Si_3N_4$ layer 8 at the bottom of the trench 6 is removed in an etching selective relative to $SiO_2$ and Si, for example with $H_3PO_4$. The surface of the monocrystalline silicon wafer 1 is thereby uncovered (see FIG. 9). The middle layer 42 of the trench mask 4 can be thinned in this etching.

Figure 10:
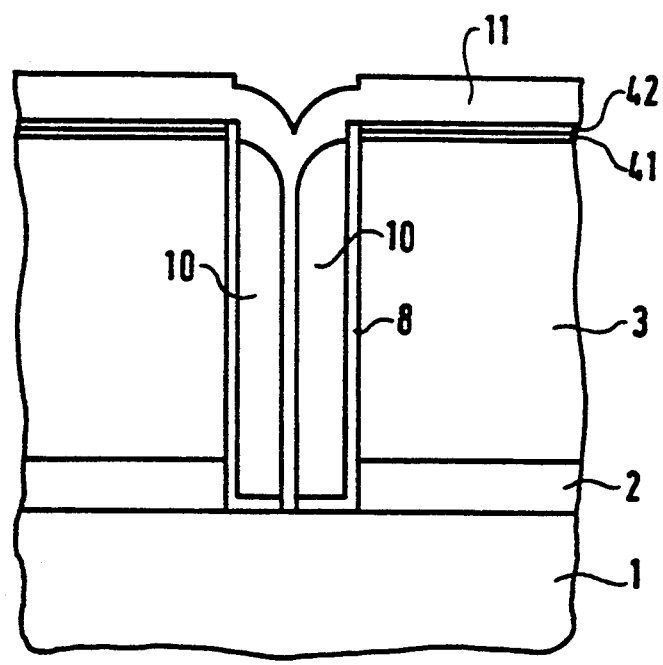
FIG. 10 shows the SOI substrate after deposition of a silicon layer that fills the trench of the present invention.
Figure 11:
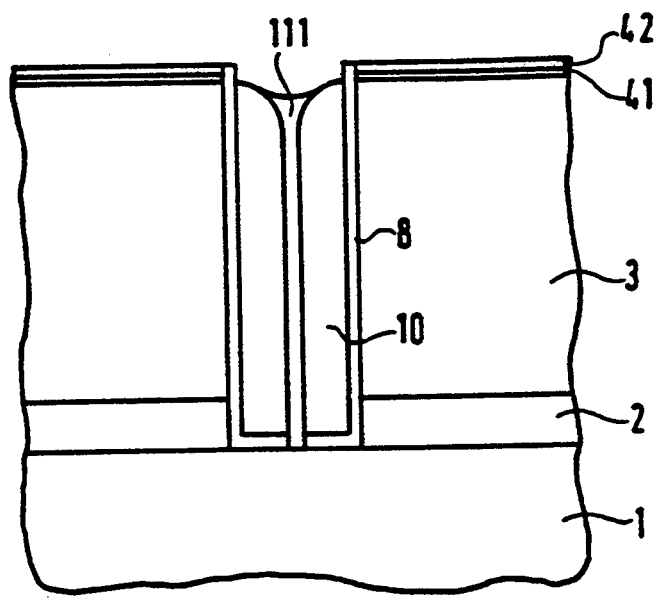
FIG. 11 shows the SOI substrate after re-etching of the silicon layer of the present invention.

The clearance remaining in the trench between the insulation structure 10 is subsequently filled by deposition of a further silicon layer 11 having amorphous silicon doped in situ (see FIG. 10). The further silicon layer 11 is subsequently selectively etched relative to $Si_3N_4$ and $SiO_2$, whereby a silicon fill 111 arises from the further silicon layer 11 (see FIG. 11 ). The etching is designed such that the upper edge of the silicon fill 111 terminates below the lower layer 41 of the trench mask 4. The doping of the further silicon layer 11 and, thus, of the silicon fill 111 is set dependent on the prescribed purpose of the trench. When the monocrystalline silicon wafer 1 is to be contacted via the trench, then the silicon fill 111 is doped with the same conductivity type as the monocrystalline silicon wafer 1. When, by contrast, the silicon fill 111 and the monocrystalline silicon wafer 1 are operated as a diode, then the two component parts are doped with opposite conductivity types.

Figure 12:
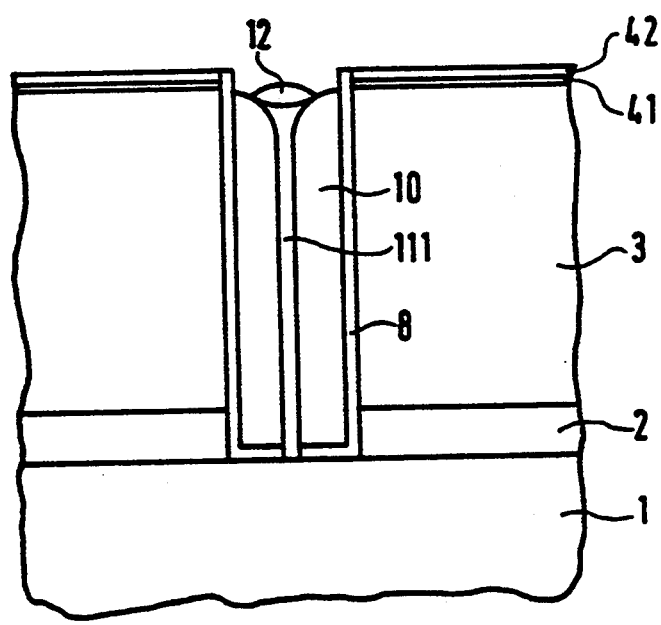
FIG. 12 shows the SOI substrate after oxidation of the surface of the silicon fill in the trench of the present invention.

An insulation termination 12 is formed self-aligned by thermal oxidation of the surface of the silicon fill 11, for example in a humid atmosphere at 1000° C. (see FIG. 12). The insulation termination 12 completely covers the silicon fill 111. In the tempering step for thermal oxidation, the dopant in the silicon fill 111 is activated. This diffuses into the monocrystalline silicon wafer 1 and forms a contact or, respectively, a pn-junction at the boundary surface to the monocrystalline silicon wafer 1. The trench mask can be subsequently removed.

Active components are subsequently manufactured in the monocrystalline silicon layer 3. Active components to be insulated are thereby annularly surrounded by a trench that is manufactured and filled in conformity with the invention. The manufacture of the components and the components themselves are not shown in detail.

After the production of the components, an intermediate oxide 13 is deposited, for example by CVD deposition of TEOS and borophosphorous silicate glass. The intermediate oxide 13 is planarized at 900° C. in an $N_2$ atmosphere over 40 minutes. A via hole 14 is opened by etching in the intermediate oxide 13 and in the insulation termination 12. The via hole 14 extends to the surface of the silicon fill 111. By deposition of a metal layer 15, the via hole 14 is filled with a metallization for contacting the silicon fill 111 (See FIG. 13). The exemplary embodiment can be analogously transferred to the manufacture of a trench in a substrate that has a plurality of silicon layers insulated from one another.

Although the invention has been described with respect to preferred embodiments, it is not to be so limited as changes and modifications can be made therein which are within the full intended scope as defined by the appended claims.

I claim:

1. Method for manufacturing a trench in a substrate, said substrate having at least one first silicon layer oriented at the surface of said substrate, an insulating layer oriented therebelow, and a second silicon layer oriented under said insulating layer, said method comprising the steps of:

providing said substrate with a trench mask having a horizontal surface;

conducting a first trench etching by performing an anisotropic dry-etching process through said trench mask down to the surface of said insulating layer to form a trench having sidewalls and a bottom;

non-conformally depositing a reinforcing protective layer surface-wide on said substrate to a greater thickness on said horizontal surface of said trench mask than at said sidewalls and bottom of said trench;

conducting a second trench etching through said trench mask down to the surface of said second silicon layer such that said first silicon layer is not attacked;

setting said thickness of said protective layer on said horizontal surface of said trench mask so that an etch-through of said insulating layer and a removal of said protective layer and said trench mask on said horizontal surface are essentially simultaneously achieved in said second trench etching;

providing said sidewalls of said trench with an insulation structure; and filling said trench with a silicon fill of doped silicon.

2. Method according to claim 1, wherein said step of non-conformally depositing a protective layer surface-wide on said substrate is further defined by forming said protective layer in a plasma-enhanced CVD method by decomposition of $Si(OC_2H_5)_4$ (TEOS).

3. Method according to claim 2, wherein said insulating layer is $SiO_2$;

wherein said step of providing said substrate with a trench mask having a horizontal surface is further defined by providing said trench mask with $SiO_2$ at least at said horizontal surface;

wherein said step of conducting a first trench etching through said trench mask down to the surface of said insulating layer to form a trench having sidewalls and a bottom is further defined by conducting said first trench etching by selectively etching relative to $SiO_2$; and wherein said step of conducting a second trench etching through said trench mask down to the surface of the second silicon layer to achieve a depth of said trench is further defined by conducting said second trench etching by selectively etching relative to silicon.

4. Method according to claim 3, wherein said step of providing said substrate with a trench mask having a horizontal surface is further defined by forming said trench mask having a lower layer of $SiO_2$, a middle layer of $Si_3N_4$ and an upper layer of $SiO_2$, said method further comprising the steps of:

selectively etching relative to silicon and $Si_3N_4$ to remove the remaining parts of said protective layer and said upper layer of said trench mask after said second trench etching;

depositing a $Si_3N_4$ layer surface-wide having essentially conformal edge coverage;

depositing an essentially conformal silicon layer surface-wide;

selectively etching said conformal silicon layer relative to $Si_3N_4$ in an anisotropic etching process to uncover horizontal surfaces of said $Si_3N_4$ layer and to produce silicon spacers at vertical sidewalls of said trench;

thermally oxidizing said silicon spacers to produce an insulation structure; and selectively etching that part of said $Si_3N_4$ layer uncovered at the bottom of said trench relative to $SiO_2$ and silicon.

5. Method according to claim 4, wherein said step of filling said trench with a silicon fill of doped silicon is further defined by forming said silicon fill by surface-wide deposition of an essentially conformal silicon layer doped in situ and by anisotropic etching said further, essentially conformal silicon layer, so that said anisotropic etching uncovers the surface of said middle layer of said trench mask and terminates said silicon under said lower layer of said trench mask;

wherein said step of thermally oxidizing said silicon spacers to produce an insulation structure is further defined by producing an insulation termination by thermal oxidation of the uncovered surface of said silicon fill, said insulation termination completely covering said silicon fill;

said method further comprising the steps of:

manufacturing micro-electronic components in said first silicon layer after the removal of said middle layer of said trench mask and of said uncovered parts of said $Si_3N_4$ layer; and opening at least one via hole after surface-wide deposition of an intermediate oxide layer, said at least one via hole extending through said intermediate oxide layer and through said insulation termination onto said silicon fill, and said at least one via hole being filled with a metallization.

6. Method according to claim 1, wherein said step of non-conformally depositing a protective layer surface-wide on said substrate is further defined by forming said protective layer by CVD deposition at atmospheric pressure (APCVD) of a material selected from the group consisting of: borosilicate glass (BSG), phosphorous silicate glass (PSG), borophosphorous silicate glass (BPSG), undoped silicate glass (NSG) and oxide.

7. Method according to claim 6, wherein said insulating layer is $SiO_2$;

wherein said step of providing said substrate with a trench mask having a horizontal surface is further defined by providing said trench mask with $SiO_2$ at least at said horizontal surface;

wherein said step of conducting a first trench etching through said trench mask down to the surface of said insulating layer to form a trench having sidewalls and a bottom is further defined by conducting said first trench etching by selectively etching relative to $SiO_2$; and wherein said step of conducting a second trench etching through said trench mask down to the surface of the second silicon layer to achieve a depth of said trench is further defined by conducting said second trench etching by selectively etching relative to silicon.

8. Method according to claim 6, wherein said step of non-conformally depositing a protective layer surface-wide on said substrate is further defined by forming said protective layer of borosilicate glass; and said method further comprises the step of:

implementing a tempering step after said step of depositing a protective layer and before said step of conducting a second trench etching to produce diffusion regions neighboring said trench in said first silicon layer by drive-out of dopant from said protective layer.

9. Method according to claim 6, wherein said step of non-conformally depositing a protective layer surface-wide on said substrate is further defined by forming said protective layer of phosphorous silicate glass; and said method further comprises the step of:

implementing a tempering step after said step of depositing a protective layer and before said step of conducting a second trench etching to produce diffusion regions neighboring said trench in said first silicon layer by drive-out of dopant from said protective layer.

10. Method according to claim 1, wherein said step of filling said trench with a silicon fill of doped silicon is further defined by filling said trench with said silicon fill of amorphous silicon doped in situ.

11. Method according to claim 1, further comprising the steps of:

providing said at least one first silicon layer is a monocrystalline silicon layer;

providing said insulating layer is a $SiO_2$ layer; and providing said second silicon layer is a monocrystalline silicon wafer, said layers forming an SOI substrate.

12. Method according to claim 11, wherein said SOI substrate has an integrated circuit with complex logic components and high-voltage power components, said method further comprising the step of:

manufacturing said trench as an insulation trench and substrate contact.

13. Method according to claim 12, wherein said step of providing said at least one first silicon layer is further defined by producing said at least one first silicon layer with a thickness of 10–30 $\mu$m; and wherein said step of conducting a first trench etching down to the surface of said insulating layer to form a trench is further defined by producing said trench with a width of 2–5 $\mu$m.

* * * * *